(12) United States Patent
Tan et al.

(10) Patent No.: US 12,028,031 B2
(45) Date of Patent: Jul. 2, 2024

(54) GALLIUM NITRIDE OPERATIONAL AMPLIFIER

(71) Applicant: Chang Gung University, Taoyuan (TW)

(72) Inventors: Cher-Ming Tan, Taoyuan (TW); Vimal Kant Pandey, Taoyuan (TW)

(73) Assignee: CHANG GUNG UNIVERSITY, Taoyuan (TW)

( * ) Notice: Subject to any disclaimer, the term of this patent is extended or adjusted under 35 U.S.C. 154(b) by 500 days.

(21) Appl. No.: 17/503,467

(22) Filed: Oct. 18, 2021

(65) Prior Publication Data
US 2023/0039249 A1    Feb. 9, 2023

(30) Foreign Application Priority Data

Aug. 6, 2021 (TW) .................................. 110129113

(51) Int. Cl.
*H03F 3/45* (2006.01)
(52) U.S. Cl.
CPC ................................ *H03F 3/45076* (2013.01)
(58) Field of Classification Search
CPC ....................................................... H03F 3/45
USPC ................................................ 330/257, 310
See application file for complete search history.

(56) References Cited

U.S. PATENT DOCUMENTS

| 6,720,830 | B2 * | 4/2004 | Andreou | ................. H03F 3/082 330/253 |
| 7,977,932 | B2 * | 7/2011 | Morishita | ............... G05F 1/465 327/543 |
| 11,768,662 | B1 * | 9/2023 | Harris | ..................... G06E 3/005 708/607 |

OTHER PUBLICATIONS

Vimal Kant Pandey et al., "GaN-Based Readout Circuit System for Reliable Prompt Gamma Imaging in Proton Therapy", Jun. 17, 2021, Applied Sciences MDPI.

* cited by examiner

*Primary Examiner* — Henry Choe
(74) *Attorney, Agent, or Firm* — BACON & THOMAS, PLLC

(57) ABSTRACT

The present invention is gallium nitride based operational amplifier because reliability and performance of the gallium nitride is better than the silicon counterpart in radiation environment. The operational amplifier includes four stages, first stage is dual input balanced output differential amplifier, second stage is dual input unbalanced differential amplifier, third stage is buffer stage to couple second and fourth stage, and fourth stage is cascaded common source amplifier with degeneration. A capacitor coupled between second and third stage is to enhance the stability of operational amplifier.

14 Claims, 3 Drawing Sheets

GALLIUM NITRIDE OPERATIONAL AMPLIFIER

BACKGROUND OF THE INVENTION

1. Field of the Invention

The present invention relates to an operational amplifier, particularly to a gallium nitride (GaN) operational amplifier for using in any harsh environment, including the high temperature environment or high radiation environment.

2. Description of the Prior Art

At present, the operational amplifier has already been widely used in various electrical home appliances, industrial fields, and scientific instrument fields. It has to be particularly noticed that the operational amplifier is especially suitable for various electronic applications, such as the key building block circuits used in filter, analog-to-digital converter, adder, and integrator etc. As for the relevant applications in environmental radiation, the reliability and performance of operational amplifier in the radiation therapy has been concerned relatively in the industry.

The operational amplifier is a high-gain voltage amplifier with DC-couple, differential-in, and single-ended output. Thus, the operational amplifier can produce the output potential more than several hundred thousand times of the input potential difference. In the description of prior art, the operational amplifier is made up of silicon material. In the existing radiation environment, such as the γ ray (Gamma ray), Neutron radiation, and heavy particle etc., the specific manufacturing way, particularly shielding by special package way, should be used to prevent the influence of radiation.

Correspondingly, due to the physical properties and structure, the electronic device made by gallium nitride (GaN) will not be influenced by the radiation environment relatively. For example, the performance of device with silicon dioxide layer under the gate electrode will be reduced significantly in the radiation environment with neutron radiation. However, the performance of device with gallium nitride under the gate electrode will quite good because there is no silicon dioxide layer.

Therefore, due to the high expectation of industry, if the operational amplifier can be made up of gallium nitride, and can be used in the radiation environment, it will satisfy the requirements of industry.

SUMMARY OF THE INVENTION

In view of the above description, the present invention proposes a gallium nitride operational amplifier, so that the operational amplifier can be used in the harsh working conditions. The corresponding electronic device system can possess high reliability even under the radiation environment.

In order to achieve the abovementioned purpose and other purposes, the present invention proposes a gallium nitride operational amplifier, which comprises a first amplifier, having a first input terminal, a second input terminal, a first output terminal, and a second output terminal, wherein the first input terminal inputs the first input voltage, the second input terminal inputs the second input voltage, the first amplifier amplifies the difference of the first input voltage and the second input voltage, the first output terminal outputs the first output voltage, and the second output terminal outputs the second output voltage.

Then, the gallium nitride operational amplifier of present invention comprises: a second amplifier connects the first amplifier. The second amplifier has a third input terminal, a fourth input terminal, and a third output. The third input terminal receives the first output voltage. The fourth input terminal receives the second output voltage. The second amplifier amplifies the difference of the first output voltage and the second output voltage. The third output terminal outputs the third output voltage. A voltage buffer device connects the second amplifier. The voltage buffer device has a fifth input terminal and a fourth output terminal. The fifth input terminal inputs the third output voltage, and the fourth output terminal outputs the fourth output voltage.

Continuously, the gallium nitride operational amplifier of present invention comprises: a third amplifier connects the voltage buffer device. The third amplifier has a sixth input terminal and a fifth output terminal. The sixth input terminal inputs the fourth output voltage. The fifth output terminal outputs the fifth output voltage. A current mirror device connects the first amplifier, the second amplifier, the voltage buffer device.

The present invention is a gallium nitride operational amplifier comprising four stages: the first stage is the dual-input balanced output differential amplifier, the second stage is the dual-input unbalanced differential amplifier, the third stage is the voltage buffer used to prevent the loading of second amplifier by the fourth amplifier, the fourth stage is the cascaded common source amplifier with degeneration, and a capacitor is connected between the second stage and the third stage to increase the stability of gallium nitride operational amplifier.

One of the advantages of the present invention is the operational amplifier made up of gallium nitride can be used for the electronic device system in the radiation environment, and without any special semiconductor process or any special package manufacturing process being required to be added.

One of the advantages of the present invention is the operational amplifier made up of gallium nitride, when it is used for the electronic device system in the radiation environment, without any manufacturing cost being increased, while the confidence level and durability of the whole electronic system can be increased.

In view of the above description, the gallium nitride operational amplifier of the present invention can greatly increase the reliability of electronic system used in the harsh environment.

One of the advantages of the present invention is that it can be used in any harsh environment, including the high temperature environment or high radiation environment.

One of the advantages of the present invention is the gallium nitride operational amplifier can be used in the proton beam therapy. Compared to the electronic device made up of silicon material, it can be used in harsh radiation environment with high reliability to obtain the purpose of better product.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

In the following description, the attached Figures will be used to describe the implementation of the present invention. In the Figures, the same symbol of element is used to represent the same element. In order to explain clearly, the size or thickness of the element may be exaggerated.

Figure 1:
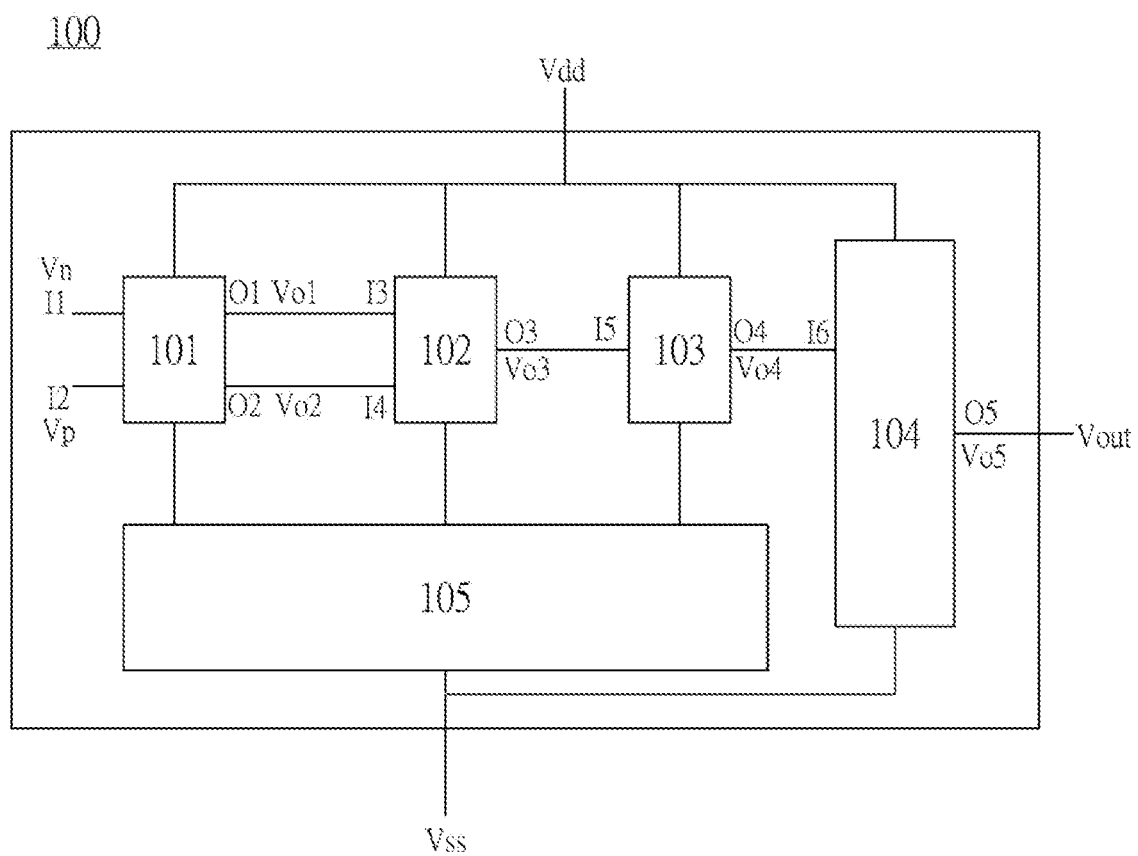
FIG. 1 shows the block diagram for the gallium nitride operational amplifier of the present invention.
Figure 2:
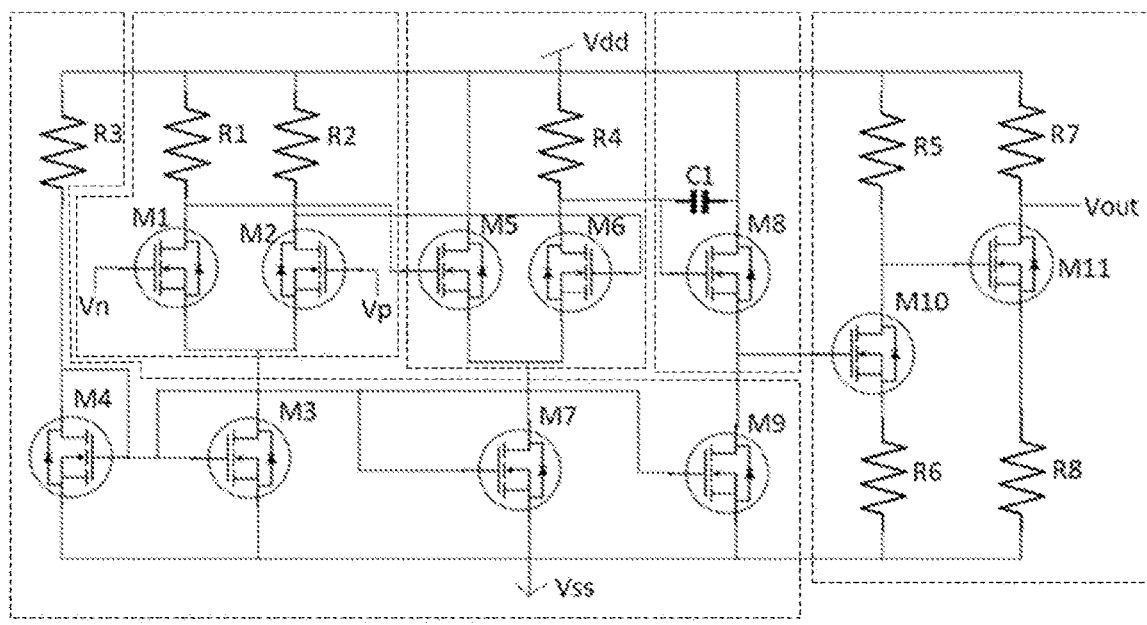
FIG. 2 shows the illustration for the gallium nitride operational amplifier of the present invention.

At first, please refer to FIG. 1 as the block diagram for the gallium nitride operational amplifier of the present invention and FIG. 2 as the illustration for the gallium nitride operational amplifier of the present invention.

Please refer to FIG. 1, in which the present invention is a gallium nitride operational amplifier 100, comprising: a first amplifier 101, a second amplifier 102, a voltage buffer device 103, a third amplifier 104, and a current mirror device 105. The first amplifier 101 has a first input terminal I1, a second input terminal I2, a first output terminal O1, and a second output terminal O2. The first input terminal I1 inputs the first input voltage Vn, and the second input terminal I2 inputs the second input voltage Vp. The first amplifier amplifies the difference of the first input voltage Vn and the second input voltage Vp. The first output terminal O1 outputs the first output voltage Vo1, and the second output terminal O2 outputs the second output voltage Vo2. The first amplifier 101, the second amplifier 102, the voltage buffer device 103, and the third amplifier 104, all are connected to the first voltage source Vdd. The third amplifier 104 and the current mirror device 105 are connected to the second voltage source Vss.

Again, please refer to FIG. 2, in which the present invention is a gallium nitride operational amplifier 100. The first amplifier 101 comprises a first resistor R1, a second resistor R2, a first transistor M1, and a second transistor M2. It has to notice that in the present invention, the first transistor M1 and the second transistor M2 are Enhancement-Mode GaN High Electron Mobility Transistor (E-mode GaN HEMT).

Still please refer to FIG. 1, in which the present invention is a gallium nitride operational amplifier 100. The first stage is a dual-input balanced output differential amplifier 101, that is the first amplifier 101 comprises a dual-input balanced output differential amplifier 101. The first input terminal I1 and the second input terminal I2 of the first amplifier 101 comprise the first differential input. The first differential input has the positive input and the negative input. The first output terminal O1 and the second output terminal O2 are the first differential output. The first differential output has positive output and negative output.

Please refer to FIG. 2, in which the present invention is a gallium nitride operational amplifier 100. One terminal of the first resistor R1 is connected to a terminal of the second resistor R2 and the first voltage source Vdd. Another terminal of the first resistor R1 is connected to the drain electrode of the first transistor M1. The drain electrode of the second transistor M2 is connected to another terminal of the second resistor R2. The source electrode of the first transistor M1 is connected to the second transistor M2. The first input voltage Vn inputs the gate electrode of the first transistor M1. The second input voltage Vp inputs the gate electrode of the second transistor M2.

Please refer to FIG. 1, in which the present invention is a gallium nitride operational amplifier 100. The second amplifier 102 connects the first amplifier 101, the second amplifier 102 has a third input terminal I3, a fourth input terminal I4, and a third output terminal O3. The third input terminal I3 receives the first output voltage Vo1, and the fourth input terminal I4 receives the second output voltage Vo2. The second amplifier amplifies the difference of the first output voltage Vo1 and the second output voltage Vo2. The third output terminal O3 outputs the third output voltage V03.

Again, please refer to FIG. 2, in which the present invention is a gallium nitride operational amplifier 100. The second amplifier 102 comprises a fifth transistor M5, a sixth transistor M6, and a fourth resistor R4. One terminal of the fourth resistor R4 is connected to the drain electrode of the sixth transistor M6, another terminal of the first resistor R1 is connected to the gate electrode of fifth transistor M5. The source electrode of the fifth transistor M5 is connected to the source electrode of the sixth transistor M6, the drain electrode of the sixth transistor M6 is connected to another terminal of the fourth resistor R4.

Still please refer to FIG. 1, in which the present invention is a gallium nitride operational amplifier 100. The second stage is a dual-input unbalanced differential amplifier 102, that is the second amplifier 102 comprised a dual-input unbalanced output differential amplifier 102, the third input terminal I3 and the fourth input terminal I4 are the second differential input, the second differential input has positive input and negative input, the second differential output has negative output.

Please refer to FIG. 1, in which the present invention is a gallium nitride operational amplifier 100. The voltage buffer device 103 connects the second amplifier 102, the voltage buffer device 103 has a fifth input terminal I5, and a fourth output terminal O4. The fifth input terminal I5 inputs the third output voltage Vo3. The fourth output terminal outputs the fourth output voltage Vo4.

Please refer to FIG. 2, the voltage buffer device 103 comprises: an eighth transistor M8 and a first capacitor C1, the gate electrode of the eighth transistor M8 is connected to a terminal of the first capacitor C1, the drain electrode of the eighth transistor M8 is connected to another terminal of the first capacitor C1, the voltage buffer device 103 can be used as the buffer stage of the second amplifier 102.

Please refer to FIG. 1, in which the present invention is a gallium nitride operational amplifier 100. The third amplifier 104 connects the voltage buffer device 103. The third amplifier 104 has a sixth input terminal I6 and a fifth output terminal O5. The sixth input terminal I6 inputs the fourth output voltage Vo4. The fifth output terminal O5 outputs the fifth output voltage Vo5, that is, the fifth output voltage Vo5 is the output voltage Vout for the gallium nitride operational amplifier 100 of the present invention.

Still please refer to FIG. 2, in which the present invention is a gallium nitride operational amplifier 100. The third amplifier 104 comprises: a fifth resistor R5, a sixth resistor R6, a seventh resistor R7, an eighth resistor R8, a tenth transistor M10, and an eleventh transistor M11. One terminal of the fifth resistor R5 is connected to a terminal of the seventh resistor R7. One terminal of the fifth resistor R5 is connected to a terminal of the first resistor R1, one terminal of the second resistor R2 is connected to another terminal of the fourth resistor R4. The drain electrode of the tenth transistor M10 is connected to the gate electrode of the eleventh transistor M11, and another terminal of the fifth resistor R5. The source electrode of the eleventh transistor M11 is connected to a terminal of the eighth resistor R8. The source electrode of the tenth transistor M10 is connected to a terminal of the sixth resistor R6, another terminal of the sixth resistor R6 is connected to another terminal of the eighth resistor R8.

Still please refer to FIG. 1, in which the present invention is a gallium nitride operational amplifier 100. The third stage 104 is coupled to second stage 102 by a buffer stage 103, wherein the third amplifier 104 comprises a cascaded common source amplifier with degeneration, and the fifth output terminal O5 is the output of gallium nitride operational amplifier 100.

The unit gain frequency for the gallium nitride operational amplifier 100 of the present invention is 34 MHz. The gain of the gallium nitride operational amplifier 100 is 70 dB, the slew rate is 20V/μs, and the common mode rejection ratio is 84.2 dB.

Please refer to FIG. 1, in which the present invention is a gallium nitride operational amplifier 100. The current mirror device 105 connects to the first amplifier 101, the second amplifier 102, and the voltage buffer device 103.

Please refer to FIG. 2, in which the present invention is a gallium nitride operational amplifier 100. The current mirror device 105 comprises a third resistor R3, a third transistor M3, a fourth transistor M4, a seventh transistor M7, and a ninth transistor M9. The gate electrode of the fourth transistor M4 is connected to the drain electrode. The gate electrodes of the third transistor M3, the seventh transistor M7 and the ninth transistor M9 are connected. The drain electrode of the ninth transistor M9, the source electrode of the eighth transistor M8 and the gate electrode of the tenth transistor M10 are connected. The source electrode of the third transistor M3, the source electrode of the fourth transistor M4, the source electrode of the seventh transistor M7 and the source electrode of the ninth transistor M9 are connected to the second voltage source Vss.

The present invention is a gallium nitride operational amplifier 100. The fourth stage 104 is the cascaded common source amplifier with degeneration, and a capacitor is connected between the second stage 102 and the third stage 103 to increase the stability of the gallium nitride operational amplifier 100.

Summarized from the above description, the present invention is a gallium nitride operational amplifier 100 comprising four stages: the first stage 101 is the dual-input balanced output differential amplifier 101, the second stage 102 is the dual-input unbalanced output differential amplifier 102, the third stage 103 is the voltage buffer used for coupling the second stage 102 and the fourth stage 104, the fourth stage 104 is the cascaded common source amplifier with degeneration, and a capacitor is connected between the second stage 102 and the third stage 103 to increase the stability of gallium nitride operational amplifier 100.

Figure 3:
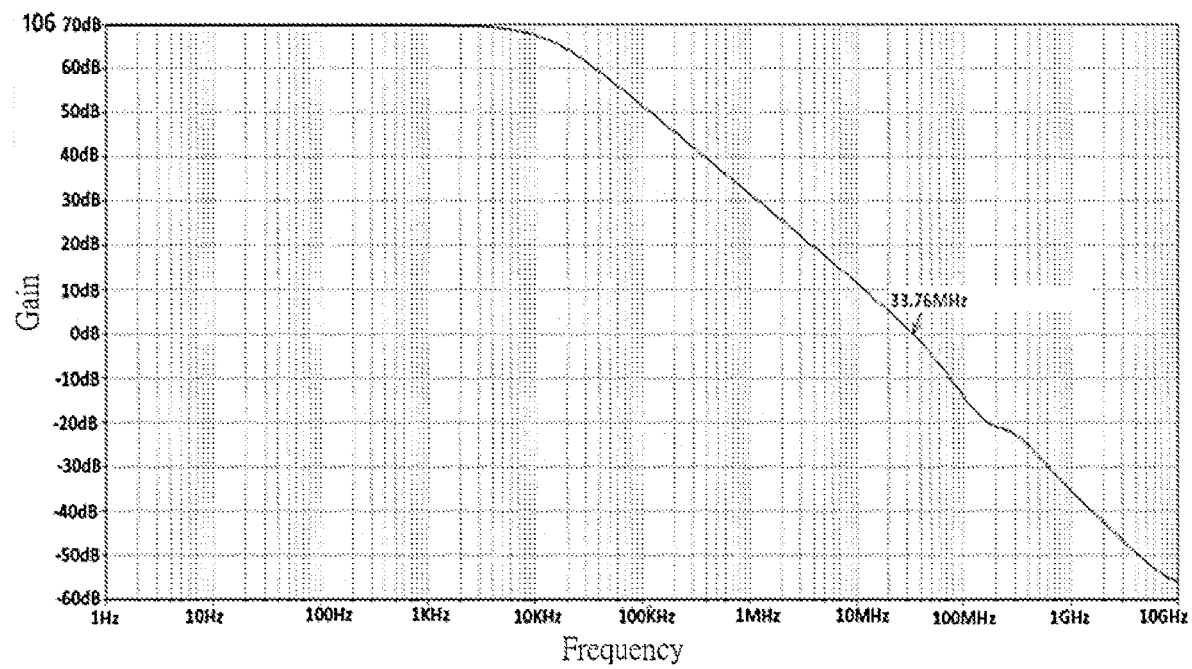
FIG. 3 shows the simulation result for the gallium nitride operational amplifier of the present invention.

FIG. 3 shows the simulation result for the gallium nitride operational amplifier 100 of the present invention. From FIG. 3, it is known that the present invention has 70 dB open-loop gain and 34 MHz unit gain frequency.

The device with gallium nitride component and the device with silicon component are different. The device with silicon component needs special manufacturing technique and packaging to protect silicon component device from the influence of radiation. The inherent characteristics of gallium nitride can prevent it from the influence of harmful radiation. For example, the gallium nitride transistor can be used in the ion propeller of aerospace field, the power conversion of satellite solar cell panel, and the distance measurement application of light. In addition, except the gallium nitride component can work under the harsh radiation environment, its advantage of small size and high efficiency also make it as the ideal electronic component in the aerospace field.

The present invention is the operational amplifier based on the gallium nitride. It can be used for the electronic device system in the radiation environment, and no special semiconductor process or special package manufacturing process is required to be added. The present invention is the operational amplifier made up of gallium nitride, when it is used for the electronic device system in the radiation environment, not any manufacturing cost is increased, while the reliability and durability of the whole electronic system can be increased. The present invention proposes a gallium nitride operational amplifier, so that the operational amplifier can be used in the harsh working conditions. The corresponding electronic device system can possess high reliability even under the radiation environment. Compared to the electronic device made up of silicon material, it can be used in harsh radiation environment with high reliability to obtain the purpose of better product. In other words, the advantage for the gallium nitride operational amplifier of the present invention is that it can be used in any harsh environment, including the high temperature environment or high radiation environment.

It is understood that various modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. A gallium nitride operational amplifier, comprising:
a first amplifier, having a first input terminal, a second input terminal, a first output terminal, and a second output terminal, wherein said first input terminal inputting a first input voltage, said second input terminal inputting a second input voltage, a first amplifier amplifying a difference of said first input voltage and said second input voltage, said first output terminal outputting a first output voltage, and said second output terminal outputting a second output voltage;
a second amplifier connecting said first amplifier, said second amplifier having a third input terminal, and a fourth input terminal, said third output terminal, said third input terminal receiving said first output voltage, said fourth input terminal receiving said second output voltage, said second amplifier amplifying said difference of said first output voltage, and said second output voltage, said third output terminal outputting a third output voltage:
a voltage buffer device connecting said second amplifier, said voltage buffer device having a fifth input terminal and a fourth output terminal, said fifth input terminal inputting said third output voltage, and said fourth output terminal outputting a fourth output voltage:
a third amplifier connecting said voltage buffer device, said third amplifier having a sixth input terminal and a fifth output terminal, said sixth input terminal inputting said fourth output voltage, said fifth output terminal outputting a fifth output voltage: and
a current mirror device connects said first amplifier, said second amplifier, and said voltage buffer device.

2. The gallium nitride operational amplifier according to claim 1, wherein said first amplifier comprises a dual-input balanced output differential amplifier.

3. The gallium nitride operational amplifier according to claim 1, wherein said first input terminal and said second input terminal of said first amplifier comprise a first differential input, said first differential input having a positive input and a negative input, said first output terminal and said second output terminal being a first differential output, said first differential output having a positive output and a negative output.

4. The gallium nitride operational amplifier according to claim 1, wherein said second amplifier comprises a dual-input unbalanced output differential amplifier, said second input terminal and said third input terminal are a second differential input, said second differential input having a positive input and a negative input, said first differential output having a negative output.

5. The gallium nitride operational amplifier according to claim 1, wherein said voltage buffer device further comprises a first capacitor, said voltage buffer device is used as a buffer stage of said second amplifier.

6. The gallium nitride operational amplifier according to claim 1, wherein said third amplifier comprises a cascaded common source amplifier with degeneration, and said fifth output terminal is an output of said gallium nitride operational amplifier.

7. The gallium nitride operational amplifier according to claim 1, wherein an unit gain frequency of said gallium nitride operational amplifier is 34 MHz.

8. The gallium nitride operational amplifier according to claim 1, wherein a gain of said gallium nitride operational amplifier being 70 dB, a slew rate being 20V/µs, and said common mode rejection ratio is 84.2 dB.

9. The gallium nitride operational amplifier according to claim 1, wherein said first amplifier comprises a first resistor, a second resistor, a first transistor, and a second transistor, said first transistor and said second transistor comprising Enhancement-Mode GaN High Electron Mobility Transistor, one terminal of said first resistor, and a terminal of said second resistor being connected to said first voltage source, another terminal of said first resistor being connected to said drain electrode of said first transistor, a drain electrode of said second transistor being connected to another terminal of said second resistor, a source electrode of said first transistor being connected to said second transistor, said first input voltage inputting a gate electrode of said first transistor, said second input voltage inputting a gate electrode of said second transistor.

10. The gallium nitride operational amplifier according to claim 1, wherein said second amplifier comprises a fifth transistor, a sixth transistor, and a fourth resistor, a gate electrode of said fifth transistor, a terminal of the first resistor being connected, a source electrode of said fifth transistor being connected to a source electrode of said sixth transistor, a drain electrode of said sixth transistor being connected to another terminal of said fourth resistor.

11. The gallium nitride operational amplifier according to claim 1, wherein said voltage buffer device comprises an eighth transistor, and a first capacitor, a gate electrode of said eighth transistor being connected to a terminal of said first capacitor, a drain electrode of said eighth transistor being connected to another terminal of said first capacitor.

12. The gallium nitride operational amplifier according to claim 1, wherein said third amplifier comprises a fifth resistor, a sixth resistor, a seventh resistor, an eighth resistor, a tenth transistor, and an eleventh transistor, one terminal of said fifth resistor being connected to a terminal of said seventh resistor, one terminal of said fifth resistor being connected to said terminal of said first resistor, said terminal of said second resistor being connected to said terminal of said fourth resistor, said drain electrode of said tenth transistor being connected to a gate electrode of said eleventh transistor and another terminal of said fifth resistor, a source electrode of said eleventh transistor being connected to a terminal of said eighth resistor, a source electrode of said tenth transistor being connected to a terminal of said sixth resistor, another terminal of said sixth resistor being connected to another terminal of said eighth resistor.

13. The gallium nitride operational amplifier according to claim 1, wherein said third amplifier comprises a cascaded common source amplifier with degeneration.

14. The gallium nitride operational amplifier according to claim 1, wherein said current mirror device comprises a third resistor, a third transistor, a fourth transistor, a seventh transistor, and a ninth transistor, a gate electrode and a drain electrode of said fourth transistor being connected, a gate electrode of said third transistor, a gate electrode of said seventh transistor and a gate electrode of said ninth transistor being connected, a drain electrode of said ninth transistor, a source electrode of said eighth transistor and a gate electrode of said tenth transistor being connected, said source electrode of a third transistor, a source electrode of said fourth transistor, a source electrode of said seventh transistor and a source electrode of said ninth transistor being connected to said second voltage source.

* * * * *